SIGNAL TRANSLATING STAGE PROVIDING DIRECT VOLTAGE

Original Filed Oct. 31, 1968

INVENTOR
Steven Steckler
BY Charles Brodsky
ATTORNEY

United States Patent Office 3,531,730
Patented Sept. 29, 1970

3,531,730
SIGNAL TRANSLATING STAGE PROVIDING DIRECT VOLTAGE

Steven Steckler, Clark, N.J., assignor to RCA Corporation, a corporation of Delaware Continuation of application Ser. No. 772,245, Oct. 31, 1968, which is a continuation-in-part of application Ser. No. 691,884, Dec. 19, 1967. This application Oct. 8, 1969, Ser. No. 866,122
Int. Cl. H03f 3/10
U.S. Cl. 330—24 14 Claims

ABSTRACT OF THE DISCLOSURE

A signal translating stage including a transistor having its base and emitter electrodes connected in parallel with a p-n junction poled in the same direction as the base-emitter diode of the transsitor. The collector electrode of the transistor is coupled via a first resistor to a direct voltage source. That source is effective in referencing a developed output signal to a level different from that to which is referenced a corresponding input signal applied to the p-n junction by means of a second resistor.

This is a continuation of application Ser. No. 772,245, filed Oct. 31, 1968, now abandoned, which application is a continuation-in-part of application Ser. No. 691,884, filed Dec. 19, 1967, now abandoned.

This invention relates to a signal translating stage and, more particularly, to linear level-shift circuits which utilize the precise matching and close thermal coupling available in integrated circuits to controllably reference an output signal to a direct voltage different from that to which a corresponding input signal is referenced.

As used herein the term integrated circuit refers to a unitary or monolithic semiconductor device or chip which is the equivalent of a network of interconnected active and passive circuit elements. Occasions often arise in integrated circuits where some form of direct current (D-C) level setting is required in the signal path. Such level setting is required, for example, where a signal referenced to a fraction of the operating potential supply voltage is to be applied to an amplifier stage designed to operate with a bias voltage equal to a different fraction of the operating supply. The use of capacitors in performing this level setting function in integrated circuit design is undesirable; first, because the capacitor occupies considerable area on the integrated device and second, because, if external to the device, the capacitor requires two of the limited number of available terminals on the chip for connection to the circuits thereon. The use of complementary transistors or Zener diodes, available for level setting in discrete circuit design, also have their limitations with respect to integrated circuits.

As will become clear hereinafter, a level-shift or level-setting circuit constructed in accordance with the invention is based upon the fact that similar collector currents flow in transistors of the same type classification having their base electrodes and emitter electrodes connected in parallel, and in semiconductor diodes connected across those same electrodes and closely matched in transistor characteristics. Using these facts, and taking advantage of the precise matching and close thermal coupling available between transistors and diodes in integrated circuits, a circuit may be constructed in which identical currents flow, to provide a level-shift action which remains substantially constant although environmental temperatures vary.

In an embodiment of the invention, a pair of integrated transistors A, B have their base electrodes and emitter electrodes connected in parallel and their collector electrodes individually coupled to one end of a pair of resistors. One transistor A, furthermore, has its collector and base electrodes shortcircuited. A direct voltage source is connected to the other end of the resistor not associated with the short-circuited collector electrode, and is effective to controllably reference a developed output signal to a level different from that to which is referenced a corresponding input signal applied to the other end of the resistor associated with the shorted collector electrode. The control over the output signal level so referenced is, as will be made apparent, primarily dependent upon the value of the direct voltage source, so that temperature variations within the level shift circuit exert substantially little effect upon its operation. Signal gain can further be provided, if desired, by the expedient of connecting additional transistors in parallel with the non-short-circuited transistor B or by selecting the direct voltage source resistor to be of a greater resistance value than the input signal resistor, or by both.

Alternatively, signal gain can be provided by employing for the non-short-circuited transistor B, a device having a larger base-emitter junction area than is had by the device employed as the short-circuited transistor A.

In another embodiment of the invention, the transistor A may be replaced by a unidirectional conducting semiconductor device poled for conduction in the same direction as the base-emitter diode of the transistor B. The semiconductor device includes a p-n junction so connected that the voltage across it is always substantially equal to the voltage across the base-emitter diode of transistor B. The anode electrode of the device, in this case, is connected to the input signal resistor and its cathode electrode is connected to the emitter electrode of the transistor B.

In one application using the level shift circuit of the invention, a phase splitter type of amplifier is described wherein different and controllable amplifications can be provided the two output signals developed. Other applications illustrate the use of the level-shift circuit in switching circuits where the prevention of transistor saturation is desired, in high-gain bandwidth amplifiers, and in forming voltage controlled oscillators.

The terms "resistors," "capacitors," "transistors," "rectifiers," "diodes," etc. as used herein are intended to apply to the equivalent device as incorporated in or on an integrated circuit device, unless otherwise indicated. The manner of implementing these components on such a device is known in the art.

For a better understanding of the present invention, reference is had to the following description taken in connection with the accompanying drawing, and its scope will be pointed out in the appended claims.

Referring to the drawing.

Figure 1:
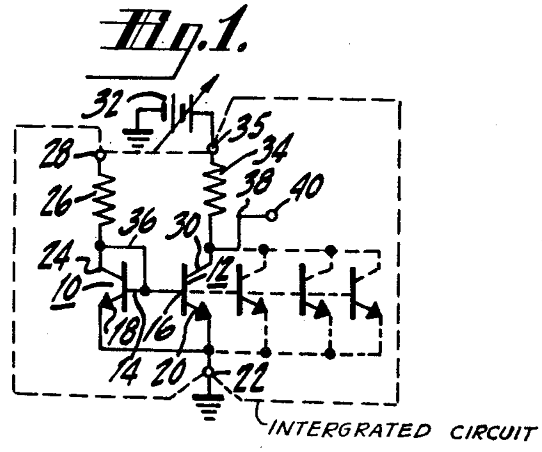
FIG. 1 is a schematic circuit diagram of a level-shift circuit embodying the present invention.

Referring now, more particularly, to FIG. 1, the level-shift circuit there shown includes a pair of transistors 10 and 12. The base electrodes 14 and 16 of these transistors are interconnected, as are their emitter electrodes 18 and 20 by means of a point of reference, or ground potential 22. The collector electrode 24 of transistor 10 is shown coupled via a first resistor 26 to an input terminal 28 while the corresponding electrode 30 of transistor 12 is coupled to a source of controllable direct voltage 32 through a second, equal resistor 34 and a terminal 35. The collector electrode 24 is further connected by a short-circuiting lead 36 to the base electrode 14, thereby arranging transistor 10 to provide a diode or rectifier type action. The collector electrode 30 is similarly connected by a lead 38 to an output terminal 40.

In operation, current will flow in the collector electrode circuit of transistor 10 when the instantaneous value of an input signal applied to terminal 28 exceeds the average forward base-to-emitter $V_{be}$ voltage of that transistor, developed at the collector electrode 24. Since the base electrodes 14 and 16 and the emitter electrodes 18 and 20 of the two transistors are connected together, and assuming the transistors 10 and 12 are of the same type classification, similar collector currents will flow in each. Where the transistors 10 and 12 are further constructed on a monolithic integrated circuit chip, these currents will tend to be identical because the base-to-emitter voltages of the transistors will be equal and because the transistors will share the same thermal environment and have like crystal structure. It will, therefore, be seen that the value of these collector currents will be given by:

$$i_{10}=i_{12}=\frac{V_{in}-V_{be_{10}}}{R_{26}} \quad (1)$$

where $i_{10}$ and $i_{12}$=the collector electrode currents of transistors 10 and 12 respectively, in milliamperes when:

$V_{in}$=the instantaneous value of an input signal applied to terminal 28, in volts;

$V_{be_{10}}$=the forward base-to-emitter voltage of transistor 10, in volts; and $R_{26}$=the resistance value of resistors 26, in kilohms.

The signal then developed at output terminal 40 by the current flow $i_{12}$ through resistor 34 can be expressed as:

$$V_{out}=V_{ref}-\frac{R_{34}}{R_{26}}(V_{in}-V_{be_{10}}) \quad (2)$$

where $V_{ref}$=the value of the direct voltage source 32, in volts; $R_{34}$=the resistance value of resistor 34, in kilohms; and $V_{in}$, $V_{be_{10}}$ and $R_{26}$ are as previously defined.

It will be apparent from this latter expression that the D-C level of the developed output signal can be primarily controlled by varying the value of the voltage source 32. Variation of the resistance ratio $R_{34}/R_{26}$ to vary the effect of the D-C component of the applied input signal or of the forward voltage of transistor 10 offers only secondary control in determining the output D-C level, and is not generally available where resistors 26 and 34 are fixed. The resistance ratio $R_{34}/R_{26}$, furthermore, will be relatively stable in an integrated circuit structure in the presence of temperature variations so that control of the output D-C level will remain substanially constant during temperature changes. In this regard, it will be understood that any change in that D-C level tending to be produced by variations in the base-to-emitter voltage $V_{be_{10}}$ with such temperature variations will be of a minor nature, and, if desired, may be easily compensated.

The level-shift circuit of FIG. 1 is, therefore, an extremely versatile configuration in that the D-C level of the developed output signal can be varied over a wide range simply by changing the value of the voltage source 32. It will be apparent that the maximum value for the voltage source 32 is that at which the rated breakdown voltage at the collector electrode 30 will not be exceeded under conditions of minimum current flow. The developed output signal will swing to the value of the source 32, as its upper limit, and to ground, as its lower limit.

The circuit of FIG. 1 can be modified so as to provide signal gain in addition to its level-shifting function. For example, with 1, 2, . . . N transistors connected in parallel with transistor 12, as shown by the dotted lines, signal gains of 2, 3, . . . $N+1$ can be provided due to the added, current flowing through resistor 34. Similarly, signal gain can be provided by selecting that resistor to be of a greater resistance value than resistor 26. With either of these arrangements, however, primary control over the output D-C level will once again be provided, and independently so, by varying the value of the voltage source 32.

Alternatively, signal gain can be provided by employing for the transistor 12, a device having a base-emitter junction area larger than the corresponding area of the transistor 10. This follows because the current gain of the configuration is proportional to the ratio of the emitter junction area of transistor 12 to the emitter junction area of transistor 10. That is, since the base-emitter diodes of the two transistors are connected in parallel, the voltages across them will be the same, as will also be their current densities. With equal current densities, the emitter currents of the transistors 10 and 12 will be in the same ratio as the respective emitter areas.

Figure 2:
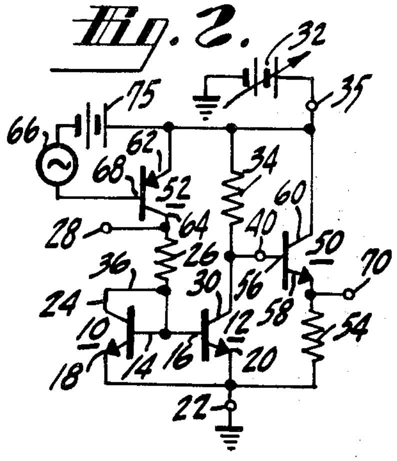
FIG. 2 is a schematic circuit diagram of the level-shift circuit of FIG. 1 used as a type of phase-splitter amplifier.

Referring now to FIG. 2, the phase-splitter amplifier there shown includes the level-shift circuit of FIG. 1, with the same reference notations as there used, and, in addition, a pair of transistors 50 and 52 and a resistor 54. More particularly, the collector electrode 30 of the level-shift circuit is connected via terminal 40 to the base electrode 56 of transistor 50, with the resistor 54 connecting its emitter electrode 58 to the ground point 22. The collector electrode 60 of transistor 50 is connected, along with the emitter electrode 62 of transistor 52, to the direct voltage source 32, while the collector electrode 64 of that latter transistor is coupled to the terminal 28. An input signal source 66 is further coupled, along with a bias supply 75, between the base electrode 68 of transistor 52 and the voltage source 32, to provide the signals to be amplified and inverted. It will be noted that transistors 10, 12 and 50 are shown as being of an NPN type while transistor 52 is of a PNP type, although these may be interchanged with polarity reversal of the sources 32 and 75. With proper polarity sources, in addition, phase splitter configurations can be constructed according to the invention using either NPN or PNP transistors only.

In operation of the FIG. 2 phase splitter, input signals applied to the base electrode 68 are amplified by transistor 52 with a gain essentially given by the product of the transconductance of transistor 52 with the resistance value of resistor 26. These amplified signals are also inverted in polarity, and appear at terminal 28, with an instantaneous value with respect to the ground point 22 being given by:

$$V_{28}=i_{52}R_{26}+V_{be_{10}} \quad (3)$$

where $i_{52}$=the collector electrode current of transistor 52, which, due to the series coupling, also equals the collector current of transistor 10. Transistor 12 similarly inverts the polarity of these amplified signals as they are applied to its base electrode 16, to produce signals of the original polarity at terminal 40 having the instantaneous value:

$$V_{40}=V_{ref}-i_{12}R_{34} \quad (4)$$

Assuming, once again, that transistors 10 and 12 are fabricated in a monolithic integrated chip so that their collector electrode currents will be substantially equal, it can be shown that the signals developed at terminal 40 and at an output terminal 70 coupled to the emitter electrode 58 will respectively be given by:

$$V_{40}=V_{ref}-\frac{R_{34}}{R_{26}}(V_{28}-V_{be_{10}}) \quad (5)$$

and by:

$$V_{out}=V_{ref}-\frac{R_{34}}{R_{26}}(V_{28}-V_{be_{10}})-V_{be_{50}} \quad (6)$$

where $V_{be_{50}}$=the forward base-to-emitter voltage of transister 50. Since $V_{be_{10}}$ and $V_{be_{50}}$ are substantially equal in the integrated circuit environment, the instaneous value of the developed output signal can be expressed as:

$$V_{out}=V_{ref}-V_{28} \quad (7)$$

when resistors 26 and 34 are of equal value. For this instance, as well as for the case where these resistors are of dissimilar value, the D-C level of the developed output signal can be primarily controlled by varying the voltage reference of the source 32. Where resistor 34, furthermore, is greater than resistor 26, signal amplification with a gain equal to their resistance ratio will additionally be provided by transistor 12.

In one construction of the phase-splitter type amplifier of FIG. 2, resistors 26, 34 and 54 were all selected to be 3 kilohms in value, and a +10-volt D-C supply was used for the reference source 32. With these values, the voltage gain provided approximately equalled unity with an output signal swing nearly equal to the 10 volt value of the supply 32. An input impedance of 3 kilohms was provided whereas the output impedance was a relatively low 90 ohms. As has been previously mentioned, control of the direct voltage delivered to the circuit by the supply 32 was effective to provide the desired D-C shift.

Figure 3:
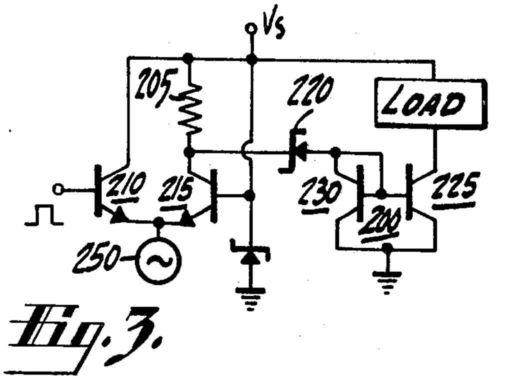
FIG. 3 is a schematic circuit diagram illustrating the use of the level-shift circuit in preventing transistor saturation in switching circuit applications.

In FIG. 3, an arrangement is shown in which the current in the level shift amplifier 200 is limited by the value of the reference source $V_S$, the collector electrode resistor 205 of the differential amplifier including transistors 210 and 215 and sharing a common current source 250, and the Zener diode 220. This current limiting serves to prevent saturation of the level shift transistor 225, even in the presence of variations in its beta value.

Figure 4:
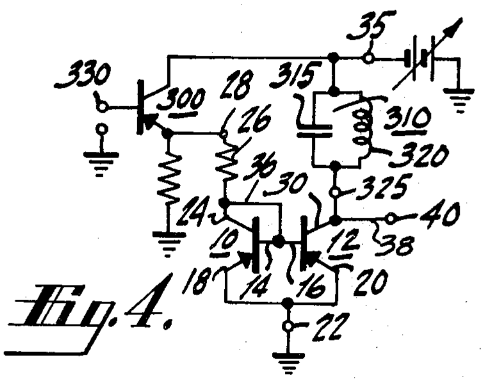
FIG. 4 is a schematic circuit diagram depicting the use of the level-shifter in a high-gain bandwidth amplifier.

The versatility of the level-shift circuit of the invention is also demonstrated in FIG. 4. Here, the transistors 10 and 12 are shown of the PNP polarity, and are arranged to provide a high gain bandwidth amplifier function along with an emitter follower stage 300 coupled to an input terminal 330. To this end, a tank circuit 310 including a capacitor 315 and an inductor 320 is substituted for the resistor 34 of either FIG. 1 or FIG. 2. The low impedance present at the base electrodes 14 and 16 effectively shunts the Miller capacity existing between the collector electrode 30 and the base electrode 16 so as to provide a wide bandwidth signal at the input electrode to the transistor 12. A similar reduction in the Miller capacitive effect is also present with an NPN amplifier configuration. It will be understood that in an integrated circuit version of this amplifier, however, the tank circuit 310 will be connected external to the chip, via a terminal 325, for example.

Figures 5, 6:
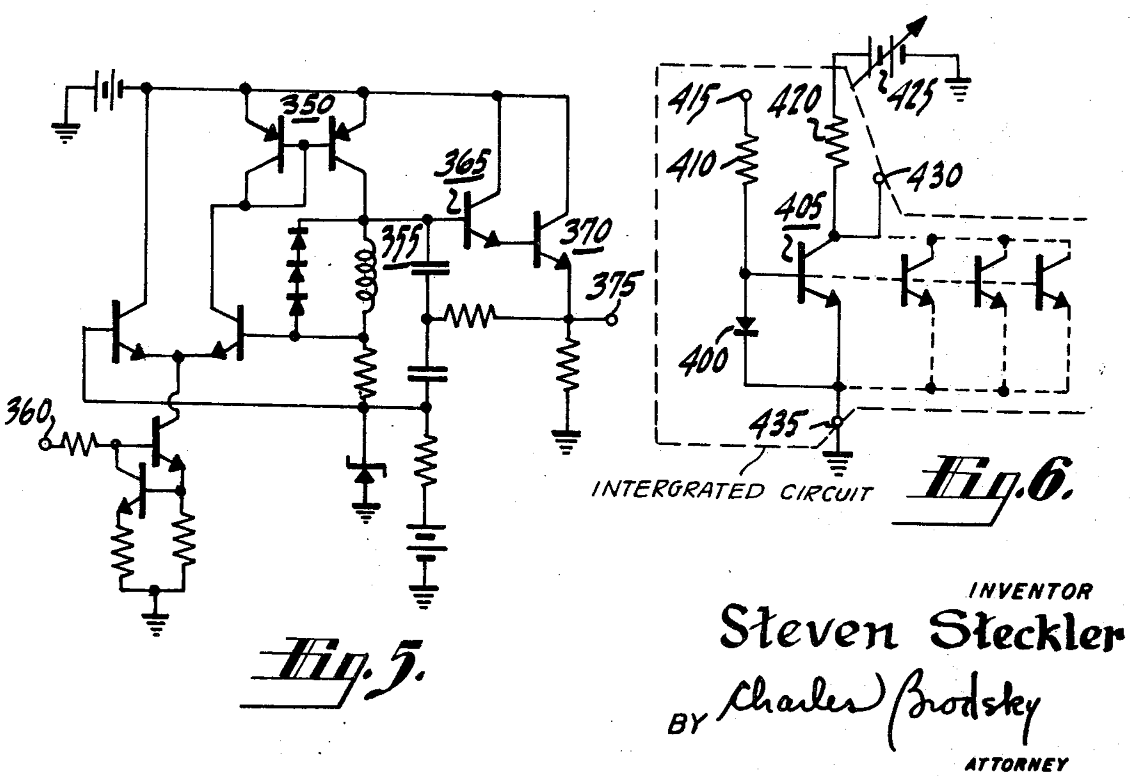
FIG. 5 is a schematic circuit diagram showing the use of the level-shift circuit in forming a voltage controlled oscillator.
FIG. 6 is a schematic circuit diagram of a modified level-shift circuit in accordance with the invention.

In FIG. 5, the level-shift circuit 350 is used in forming a voltage controlled oscillator. A quadrature signal is fed by the circuit 350 into the oscillator tank 355, with the control voltages being applied via input terminal 360. The oscillatory signals are taken from the emitter follower transistors 365 and 370 at the output terminal 375.

The level-shift circuit of FIG. 6 illustrates another embodiment of the present invention. A unidirectional conducting semiconductor device 400 is connected in parallel with base-emitter diode of a transistor 405, and is poled for conduction in the same manner as the diode. A first resistor 410 couples the junction of the anode electrode of device 400 and the base electrode of transistor 405 to an input terminal 415 while a second resistor 420 couples the collector electrode of transistor 405 to a source of direct voltage 425 and to an output terminal 430. The junction of the cathode electrode of device 400 and the emitter electrode of transistor 405 is connected to a point of reference, or ground potential 435.

Where the characteristics of the p-n junction of the semiconductor device 400 are closely matched to those of the base-emitter diode of the transistor 405, similar currents will flow through each. Where they further share the same thermal environment, as in an integrated circuit structure, these currents will tend to be identical.

Under these conditions, it can be shown that when the instantaneous value of an applied signal exceeds the forward voltage drop of the semiconductor device 400, this configuration will develop a signal at its output terminal 430 as given by the expression:

$$V_{out}=V_{ref}-\frac{R_{420}}{R_{410}}(V_{in}-V_{be_{400}} \quad (8)$$

where $V_{ref}$=the value of the direct voltage source 425;
$V_{in}$=the instantaneous value of an input signal applied to terminal 415;
$V_{be_{400}}$=the forward voltage of the semiconductor device 400; and
$R_{410}$ and $R_{420}$=the resistance values of resistors 410 and 420, respectively.

The similarity between Expressions 8 and 2 will be readily apparent. Also apparent will be the fact that as with the level-shift circuit of FIG. 1, the value of the voltage source 425 primarily controls the D-C level of the developed output signal. Similarly, signal gain can also be provided in this configuration by paralleling additional output transistors (shown by the dotted lines), by selecting resistor 420 to be of a greater resistance value than resistor 410, or by employing a transistor 405 having a base-emitter junction area which is larger than the p-n junction area of the device 400, or by any combination of these arrangements.

What is claimed is:

1. A signal translating stage comprising:
a first semiconductor device having first, second and third electrodes;
a second semiconductor device having at least first and second electrodes;
said first and second semiconductor devices having substantially proportionally related conduction characteristics;
means for coupling said second electrodes of said semiconductor devices to each other;
input circuit means comprising a first resistance coupled to said first electrodes of said first and second semiconductor devices for supplying signals to be translated by said stage and for coupling a source of direct input voltage to said second device, said supplied signals being referenced to said direct input voltage; and
output circuit means, including a source of direct energizing potential and a second resistance, coupled to said third electrode of said first semiconductor device for deriving translated signals corresponding to said supplied signals, but referenced to a second direct voltage level established by the ratio of said second and first resistances, the ratio of the junction areas associated said first and second electrodes of said first and second semiconductor devices and the value of said energizing potential.

2. A signal translating stage as defined in claim 1 wherein said first and second semiconductor devices comprise first and second transistors disposed in a single integrated circuit, said second transistor further comprising a third electrode, and wherein said first, second and third electrodes correspond to the base, emitter and collector electrodes of said transistors, respectively.

3. A signal translating stage as defined in claim 2 wherein there is additionally included N transistors disposed in said integrated circuit, each having its base, emitter and collector electrodes respectively coupled to the corresponding electrodes of said first transistor device, to provide a signal gain for said translated signals substantially equal to $N+1$, N representing a positive integer of one or more.

4. A signal translating stage as defined in claim 2 wherein said input circuit means include a first resistor coupling a source of signals to be translated to the collector electrode of said second transistor device, wherein said output circuit means includes a second resistor coupling said source of energizing potential to the collector electrode of said first transistor device, and wherein a signal gain substantially equal to the resistance ratio between said second and first resistors is provided for said translated signals.

5. A signal translating stage as defined in claim 2 wherein said transistor devices have base-emitter junctions of unequal areas, to provide a signal gain for said translated signals substantially equal to the ratio between the junction area of said first transistor to the junction area of said second ransistor.

6. A signal translating stage comprising:

first and second transistors, each having base, emitter and collector electrodes;

means coupling said base electrodes and said emitter electrodes in parallel;

means connecting the collector and base electrodes of said second transistor;

a source of input signals to be translated, said signals being referenced to a first direct voltage;

means including a first resistor coupling said signal source including said first direct voltage to the collector electrode of said second transistor;

a source of energizing potential, and a second resistor coupling said energizing source to the collector electrode of said first transistor;

whereby translated signals corresponding to said input signals are derived at the collector electrode of said first transistor referenced to a second, direct voltage primarily established by the value of said energizing potential.

7. A signal translating stage as defined in claim 6 wherein the emitter electrodes of said first and second transistors are each connected to a point of reference potential and wherein the instantaneous value of the translated signals derived at the collector electrode of said first transistor with respect to said reference potential is given by:

$$V_{out}=V_{ref}-\frac{R_2}{R_1}(V_{in}-V_{be})$$

where $V_{out}$=the instantaneous value of the derived translated signals;

$V_{in}$=the instantaneous value of the input signals to be translated;

$V_{ref}$=the value of said energizing potential;

$R_1$=the resistance value of said first resistor;

$R_2$=the resistance value of said second resistor; and $V_{be}$=the forward base electrode-to-emitter eleectrode voltage of said second transistor.

8. A signal translating stage comprising:

a first semiconductor device having first, second and third electrodes;

a second semiconductor device naving at least first and second electrodes;

said first and second semiconductor devices having substantially proportionally related conduction characteristics;

means for coupling said second electrodes of said semiconductor devices to each other;

input circuit means comprising a first resistance coupled to said first electrodes of said first and second semiconductor devices for supplying signals to be translated by said stage and for coupling a source of direct input voltage to said second device, said supplied signals being referenced to said direct input voltage; and output circuit means, including a source of direct energizing potential and a second resistance, coupled to said third electrode of said first semiconductor device for deriving translated signals corresponding to said supplied signals, but referenced to a second direct voltage level primarily established by the value of said energizing potential.

9. A signal translating stage as defined in claim 8 wherein said first semiconductor device comprises a transistor, wherein the first, second and third electrodes of said first device correspond to the base, emitter and collector electrodes of said transistor, respectively, and wherein said second semiconductor device comprises at least a p-n junction connected in parallel with said base and emitter electrodes and poled in the same direction as the base-emitter diode of said transistor.

10. A signal translating stage as defined in claim 8 wherein said first and second semiconductor devices comprise first and second transistors disposed in a single integrated circuit, said second transistor further comprising a third electrode, and wherein said first, second and third electrodes correspond to the base, emitter and collector electrodes of said transistors, respectively.

11. A signal translating stage as defined in claim 10 wherein said input circuit means includes a first resistor coupling a source of signals to be translated to the collector electrode of said second transistor device, wherein said output circuit means includes a second resistor coupling said source of energizing potential to the collector electrode of said first transistor device, and wherein a signal gain substantially equal to the resistance ratio between said second and first resistors is provided for said translated signals.

12. A signal translating stage comprising:

first and second transistors, each having base, emitter and collector electrodes;

means coupling said base electrodes and said emitter electrodes in parallel;

means connecting the collector and base electrodes of said second transistor;

a source of input signals to be translated, said signals being referenced to a first direct voltage;

means including a first resistor coupling said signal source including said first direct voltage to the collector electrode of said second transistor;

a source of energizing potential; and a second resistor coupling said energizing source to the collector electrode of said first transistor;

whereby translated signals corresponding to said input signals as derived at the collector electrode of said first transistor referenced to a second direct voltage established by the ratio of said second and first resistors, the ratio of the base-emitter areas of said first and second transistors and the value of said energizing potential.

13. A signal translating stage as defined in claim 12 wherein the emitter electrodes of said first and second transistors are each connected to a point of reference potential and wherein the instantaneous value of the translated signals derived at the collector electrode of said first transistor with respect to said reference potential is given by:

$$V_{out}=V_{ref}-\frac{R_2}{R_1}(V_{in}-V_{be})$$

where $V_{out}$=the instantaneous value of the derived translated signals;

$V_{in}$=the instantaneous value of the input signals to be translated;

$V_{ref}$=the value of said energizing potential;

$R_1$=the resistance valve of said first resistor;

$R_2$=the resistance value of said second resistor; and $V_{be}$=the forward base electrode-to-emitter electrode voltage of said second transistor.

14. A signal translating stage as defined in claim 12 wherein said transistor devices have base-emitter junctions of unequal areas, to provide a signal gain for said translated signals substantially equal to the ratio between the junction area of said first transistor to the junction area of said second transistor.

References Cited

UNITED STATES PATENTS

| | | | |
|---|---|---|---|
| 3,391,311 | 7/1968 | Lin et al. | 307—303 X |
| 3,392,342 | 7/1968 | Ordower | 330—22 |
| 3,393,328 | 7/1968 | Meadows et al. | 330—38 X |

OTHER REFERENCES

Blaser: "An Integrated Circuit for Consumer Products," Electronic World, October 1966, pp. 32, 33.

Ivesdal: "Basics of Integrated Circuit Components," Electronic Design, April 13, 1964, pp. 50–52.

Widlar: "Design Techniques for Linear Integrated Circuits," Electronic Communicator, November/December 1966, pp. 7, 8.

ROY LAKE, Primary Examiner

J. B. MULLINS, Assistant Examiner

U.S. Cl. X.R.

330—19, 38; 331—117, 332—40

UNITED STATES PATENT OFFICE

CERTIFICATE OF CORRECTION

Patent No. 3,531,730 Dated September 29, 1970

Inventor(s) Steven Steckler

It is certified that error appears in the above-identified patent and that said Letters Patent are hereby corrected as shown below:

In the title, after "Voltage" add --Translation--. In the drawing, Figures 1 and 6, that portion reading "Intergrated Circuit" should read --Integrated Circuit--. Column 1, line 18, that portion reading "transsitor" should read --transistor--. Column 3, line 64, that portion reading "substanially" should read --substantially--. Column 6, line 10, that portion of the expression reading "$(V_{in} - V_{be_{400}}$" should read --$(V_{in} - V_{be_{400}})$--. Column 6, line 21, that portion reading "Expressions" should read --expressions--. Column 7, line 16, that portion reading "ransistor" should read --transistor--; line 56, that portion reading "eleectrode" should read --electrode--; line 62, that portion reading "naving" should read --having--. Column 8, line 74, that portion reading "valve" should read --value--.

SIGNED AND SEALED DEC 15 1970

(SEAL)
Attest:

Edward M. Fletcher, Jr.
Attesting Officer

WILLIAM E. SCHUYLER, JR.
Commissioner of Patents

FORM PO-1050 (10-69)

USCOMM-DC 60376-P69
★ U.S. GOVERNMENT PRINTING OFFICE : 1969 O—366-334